(12) United States Patent
Jean

(10) Patent No.: US 9,542,287 B1
(45) Date of Patent: *Jan. 10, 2017

(54) SYSTEMS AND METHODS FOR ERROR INJECTION IN DATA STORAGE SYSTEMS

(71) Applicant: WESTERN DIGITAL TECHNOLOGIES, INC., Irvine, CA (US)

(72) Inventor: Sebastien A. Jean, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 346 days.

This patent is subject to a terminal disclaimer.

(21) Appl. No.: 14/185,255

(22) Filed: Feb. 20, 2014

Related U.S. Application Data

(63) Continuation of application No. 13/297,089, filed on Nov. 15, 2011, now Pat. No. 8,707,104, which is a
(Continued)

(51) Int. Cl.
G06F 11/22 (2006.01)
G11C 29/38 (2006.01)
G06F 11/07 (2006.01)

(52) U.S. Cl.
CPC ....... G06F 11/2215 (2013.01); G06F 11/0793 (2013.01); G11C 29/38 (2013.01)

(58) Field of Classification Search
CPC ... G06F 11/0793; G06F 11/0727; G06F 11/10; G06F 11/2733; G06F 11/2215; G06F 11/1048; G11C 29/38
(Continued)

(56) References Cited

U.S. PATENT DOCUMENTS 6,148,354 A 11/2000 Ban et al.
6,182,248 B1 1/2001 Armstrong et al.
(Continued)

FOREIGN PATENT DOCUMENTS

WO 2011019596 A2 2/2011

OTHER PUBLICATIONS

U.S. Appl. No. 13/297,082, filed Nov. 15, 2011, to Jean, et al., 28 pages.
(Continued)

*Primary Examiner* — Joseph D Manoskey
(74) *Attorney, Agent, or Firm* — Knobbe, Martens, Olson & Bear, LLP

(57) ABSTRACT

Embodiments of the solid-state storage system provided herein are configured to perform improved mechanisms for testing of error recovery of solid state storage devices. In some embodiments, the system is configured to introduce or inject errors into data storage commands or operations performed in the non-volatile memory. Injected errors include corruption of data stored in the non-volatile memory, deliberate failure to execute storage operations, and errors injected into communication protocols used between various elements of the device. In some embodiments, injected errors can include direct errors that trigger an immediate execution of error recovery mechanisms and delayed errors that trigger execution of error recovery mechanisms at a later time. Error recovery mechanisms can be tested in an efficient, reliable, and deterministic manner to help ensure effective operation of storage devices. The integrity of non-volatile memory can also be tested.

32 Claims, 7 Drawing Sheets

Related U.S. Application Data continuation of application No. 13/226,416, filed on Sep. 6, 2011, now abandoned.

(58) Field of Classification Search
USPC ............ 714/6.23, 6.1, 6.11, 6.24, 25, 41, 42, 48, 714/52, 53, 54
See application file for complete search history.

(56) References Cited

U.S. PATENT DOCUMENTS

| | | |
|---|---|---|
| 6,304,984 B1 | 10/2001 | Neal et al. |
| 6,519,718 B1 | 2/2003 | Graham et al. |
| 6,735,661 B2 | 5/2004 | Gelke et al. |
| 6,785,767 B2 | 8/2004 | Coulson |
| 6,856,556 B1 | 2/2005 | Hajeck |
| 6,988,175 B2 | 1/2006 | Lasser |
| 7,103,684 B2 | 9/2006 | Chen et al. |
| 7,126,857 B2 | 10/2006 | Hajeck |
| 7,127,549 B2 | 10/2006 | Sinclair |
| 7,136,973 B2 | 11/2006 | Sinclair |
| 7,430,136 B2 | 9/2008 | Merry, Jr. et al. |
| 7,447,807 B1 | 11/2008 | Merry et al. |
| 7,460,394 B2 | 12/2008 | Happ et al. |
| 7,502,256 B2 | 3/2009 | Merry, Jr. et al. |
| 7,509,441 B1 | 3/2009 | Merry et al. |
| 7,587,639 B2 * | 9/2009 | Marisetty ............ G06F 11/3672 714/41 |
| 7,594,135 B2 | 9/2009 | Gonzalez et al. |
| 7,596,643 B2 | 9/2009 | Merry, Jr. et al. |
| 7,623,401 B2 | 11/2009 | Philipp et al. |
| 7,631,245 B2 | 12/2009 | Lasser |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,716,411 B2 | 5/2010 | Panabaker et al. |
| 7,733,712 B1 | 6/2010 | Walston et al. |
| 7,765,373 B1 | 7/2010 | Merry et al. |
| 7,861,038 B2 | 12/2010 | Fontenot et al. |
| 7,861,122 B2 | 12/2010 | Cornwell et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,957,173 B2 | 6/2011 | Kim |
| 7,962,777 B2 | 6/2011 | Gonzalez et al. |
| 7,962,792 B2 | 6/2011 | Diggs et al. |
| 7,970,978 B2 | 6/2011 | Luo et al. |
| 8,065,304 B2 | 11/2011 | Ross |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,120,969 B1 | 2/2012 | Montierth et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,291,295 B2 | 10/2012 | Harari et al. |
| 8,296,625 B2 | 10/2012 | Diggs et al. |
| 8,312,207 B2 | 11/2012 | Merry, Jr. et al. |
| 8,315,092 B2 | 11/2012 | Strasser et al. |
| 8,316,176 B1 | 11/2012 | Phan et al. |
| 8,341,339 B1 | 12/2012 | Boyle et al. |
| 8,341,374 B2 | 12/2012 | Kwon et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,443,263 B2 | 5/2013 | Selinger et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2002/0053010 A1 | 5/2002 | Piccirillo et al. |
| 2003/0165076 A1 | 9/2003 | Gorobets et al. |
| 2003/0172261 A1 | 9/2003 | Lee et al. |
| 2005/0160217 A1 | 7/2005 | Gonzalez et al. |
| 2005/0223373 A1 | 10/2005 | Gage et al. |
| 2005/0251617 A1 | 11/2005 | Sinclair et al. |
| 2006/0248387 A1 | 11/2006 | Nicholson et al. |
| 2007/0038901 A1 | 2/2007 | Shiota et al. |
| 2007/0180328 A1 | 8/2007 | Cornwell et al. |
| 2007/0190328 A1 | 8/2007 | Cowburn et al. |
| 2007/0220202 A1 | 9/2007 | Sutardja et al. |
| 2007/0245092 A1 | 10/2007 | Yeh |
| 2007/0288683 A1 | 12/2007 | Panabaker et al. |
| 2007/0288692 A1 | 12/2007 | Bruce et al. |
| 2008/0040531 A1 | 2/2008 | Anderson |
| 2008/0192928 A1 | 8/2008 | Yu et al. |
| 2008/0215808 A1 | 9/2008 | Ashmore et al. |
| 2008/0250270 A1 | 10/2008 | Bennett |
| 2009/0013233 A1 | 1/2009 | Radke |
| 2009/0024793 A1 | 1/2009 | Fontenot et al. |
| 2009/0037652 A1 | 2/2009 | Yu et al. |
| 2009/0063730 A1 | 3/2009 | Gower et al. |
| 2009/0158124 A1 | 6/2009 | Kawai et al. |
| 2009/0172257 A1 | 7/2009 | Prins et al. |
| 2009/0240873 A1 | 9/2009 | Yu et al. |
| 2009/0282305 A1 | 11/2009 | Chen et al. |
| 2009/0313411 A1 | 12/2009 | Stenfort |
| 2010/0023800 A1 | 1/2010 | Harari et al. |
| 2010/0037012 A1 | 2/2010 | Yano et al. |
| 2010/0088459 A1 | 4/2010 | Arya et al. |
| 2010/0100675 A1 | 4/2010 | Furuhjelm |
| 2010/0122022 A1 | 5/2010 | Luo et al. |
| 2010/0174849 A1 | 7/2010 | Walston et al. |
| 2010/0174851 A1 | 7/2010 | Leibowitz et al. |
| 2010/0180182 A1 | 7/2010 | Trantham |
| 2010/0205517 A1 | 8/2010 | Lee et al. |
| 2010/0217924 A1 | 8/2010 | Panabaker et al. |
| 2010/0250793 A1 | 9/2010 | Syu |
| 2010/0268874 A1 | 10/2010 | Pyeon |
| 2010/0281342 A1 | 11/2010 | Chang et al. |
| 2010/0325352 A1 | 12/2010 | Schuette et al. |

(56) References Cited

U.S. PATENT DOCUMENTS

| | | |
|---|---|---|
| 2010/0327923 A1 | 12/2010 | Pyeon et al. |
| 2011/0010491 A1 | 1/2011 | Anderson |
| 2011/0035540 A1 | 2/2011 | Fitzgerald et al. |
| 2011/0040924 A1 | 2/2011 | Selinger |
| 2011/0041039 A1 | 2/2011 | Harari et al. |
| 2011/0082985 A1 | 4/2011 | Haines et al. |
| 2011/0099323 A1 | 4/2011 | Syu |
| 2011/0107076 A1 | 5/2011 | Kim et al. |
| 2011/0119442 A1 | 5/2011 | Haines et al. |
| 2011/0138112 A1 | 6/2011 | Chiang et al. |
| 2011/0145489 A1 | 6/2011 | Yu et al. |
| 2011/0283049 A1 | 11/2011 | Kang et al. |
| 2011/0283135 A1 | 11/2011 | Burger et al. |
| 2011/0289267 A1 | 11/2011 | Flynn et al. |
| 2011/0320915 A1 | 12/2011 | Khan |
| 2012/0102263 A1 | 4/2012 | Aswadhati |
| 2012/0131268 A1 | 5/2012 | Anderson |
| 2012/0203951 A1 | 8/2012 | Wood et al. |
| 2012/0221922 A1 | 8/2012 | Bennett |
| 2012/0233380 A1 | 9/2012 | Butterfield |
| 2012/0260020 A1 | 10/2012 | Suryabudi et al. |
| 2012/0265926 A1 | 10/2012 | Tal et al. |
| 2012/0278531 A1 | 11/2012 | Horn |
| 2012/0284460 A1 | 11/2012 | Guda |
| 2012/0324191 A1 | 12/2012 | Strange et al. |
| 2013/0060981 A1 | 3/2013 | Horn et al. |
| 2013/0073785 A1 | 3/2013 | Emma et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

OTHER PUBLICATIONS

Office Action dated Mar. 29, 2013 U.S. Appl. No. 13/297,082, 14 pages.
U.S. Appl. No. 13/297,163, filed Nov. 15, 2011, to Jean, et al., 41 pages.
Office Action dated Oct. 25, 2013 from U.S. Appl. No. 13/297,082, 38 pages.
Office Action dated Oct. 23, 2013 from U.S. Appl. No. 13/297,163, 34 pages.
Interview Summary dated Jan. 27, 2014 from U.S. Appl. No. 13/297,163, 3 pages.
Interview Summary dated Jan. 28, 2014 from U.S. Appl. No. 13/297,082, 3 pages.
Office Action dated Oct. 29, 2013 U.S. Pat. No. 8,700,834, 46 pages.
Notice of Allowance dated Feb. 10, 2014 U.S. Pat. No. 8,700,834, 75 pages.
Office Action dated Jul. 31, 2013 from U.S. Appl. No. 13/297,089, 15 pages.
Notice of Allowance dated Dec. 23, 2013 from U.S. Appl. No. 13/297,089, 6 pages.
Interview Summary dated Oct. 29, 2013 from U.S. Appl. No. 13/297,089, 3 pages.

* cited by examiner

SYSTEMS AND METHODS FOR ERROR INJECTION IN DATA STORAGE SYSTEMS

CROSS REFERENCE TO RELATED APPLICATION

This application is a continuation of U.S. patent application Ser. No. 13/297,089, filed on Nov. 15, 2011, which is a continuation of U.S. patent application Ser. No. 13/226,416, filed on Sep. 6, 2011. The disclosures of these prior applications are hereby incorporated by reference in their entirety.

BACKGROUND

Technical Field

This disclosure relates to non-volatile storage subsystems, including but not limited to non-volatile drives. More particularly, the disclosure relates to systems and methods for improved mechanisms for testing of error recovery of solid state storage devices.

Description of the Related Art

Non-volatile memory devices can be used to store data communicated by host devices over various interfaces. Various communication protocols are used to facilitate this data exchange. These communication protocols need to be reliably implemented by data storage systems that include host devices and non-volatile memory devices.

Non-volatile memory devices store information in an array of memory cells constructed with floating gate transistors. Typically, non-volatile memory devices can endure a limited number of write cycles over its useful life. Various factors can contribute to data errors in non-volatile memory devices, which include charge loss or leakage over time, read disturb, and device wear caused by program/erase cycles. Non-volatile memory degradation can cause stored data to be corrupted. For example, when the number of bit errors on a read operation exceeds the ECC (error correction code) correction's capability of the non-volatile memory device, a read operation fails.

Data storage systems are generally required to meet certain thresholds for data reliability and for speed of data storage and retrieval. To meet these thresholds, data storage systems generally include various error recovery mechanisms, which need to be efficient and robust. Error recovery mechanisms can detect or correct errors due to the communication protocols as well as due to data errors of non-volatile memory devices. A reliable data storage system needs to implement capabilities to test the error recovery mechanisms in a timely, efficient, and reliable manner.

One known method for testing error recovery mechanisms is to program and erase non-volatile memory cells an arbitrary and random manner. However, this method tends to "wear out" or degrade the endurance of the non-volatile memory, while lacking the ability to perform tests in a deterministic manner. As a result, this method is generally not useful for testing error recovery mechanisms.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

Figure 1A:
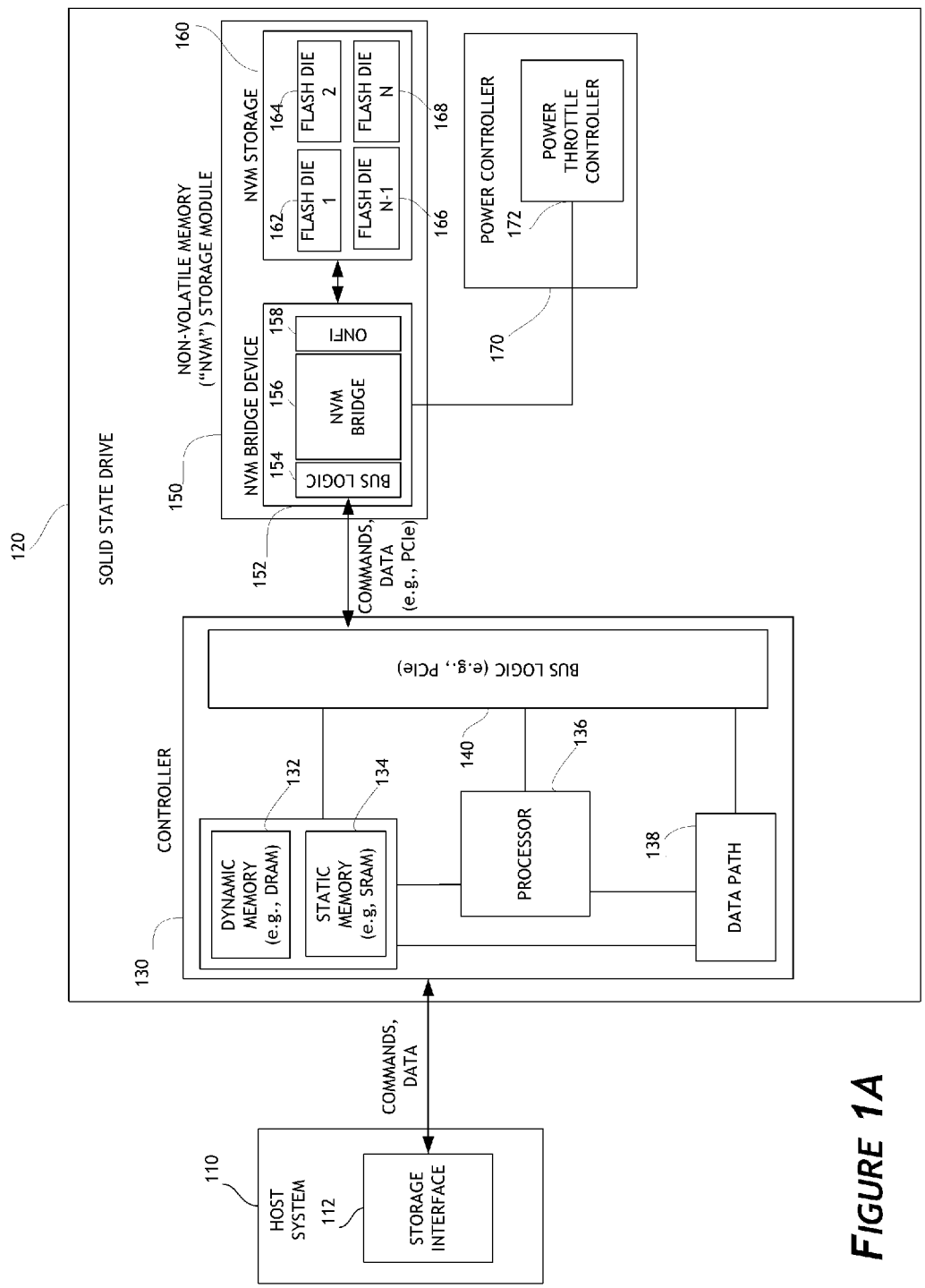
FIGS. 1A-1B are block diagrams illustrating the controller architecture according to some embodiments of the invention.

While certain embodiments of the inventions are described, these embodiments are presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions.

Overview

Embodiments of the solid-state storage system provided herein are configured to perform improved mechanisms for testing error recovery of data storage systems that include non-volatile memory comprising a plurality of storage elements, such as pages. Although "page" and "pages" are used throughout this disclosure, those skilled in art would appreciate that some embodiments are applicable to other units of storage such as planes, sectors, blocks, etc. In some embodiments, "error recovery" refers to error monitoring, error detection, and/or error correction.

In some embodiments, the above described improved mechanisms for testing error recovery are implemented in a system that includes a controller device coupled with a non-volatile memory (NVM) storage module which has a bridge device and a NVM storage unit with NVM elements (e.g., NAND). The controller device in one embodiment is configured to communicate with the bridge device over a high speed interface such as PCIe, and the bridge device is coupled with the NVM storage unit via an interface such as ONFI. The controller is provided physical, page-level access/control to the NVM in some embodiments. The respective capabilities of the controller and the bridge are further described below.

In some embodiments, the bridge device is configured to inject or introduce errors into storage access commands or operations performed in the non-volatile memory. The controller device can configure the bridge to inject errors. In some embodiments, an injected error can comprise a deliberate corruption of portions (or entirety) of data stored in the non-volatile memory. When the corrupted data is being retrieved, the bridge device can perform error recovery, which can include detecting and correcting data corruptions (e.g., by using ECC). In some embodiments, the efficiency (e.g., speed) of error recovery can be measured.

In some embodiments, injected error can comprise a deliberate introduction of errors into commands and/or messages exchanged between the controller device and the bridge over the high speed interface. For example, the bridge device can be configured to introduce errors into messages directed to various queues of the controller device used for facilitating communication over the high speed interface. The controller can perform error recovery, which includes detecting the injected errors, attempting to correct the injected errors, and/or discarding corrupted messages.

In some embodiments, injected errors can be categorized as "direct" or "delayed." "Direct" errors can include errors that trigger an immediate or non-delayed error recovery following the execution of a storage access command or operation into which the error was introduced. For example, an injected error indicating that a non-volatile memory read operation failed is a direct error. "Delayed" error can include errors that are introduced but not detected or corrected until some time later. For example, an error injecting corruption of data stored in the non-volatile memory is a delayed error, which can be detected and corrected (e.g., by using ECC) during execution of a subsequent read operation of the corrupted data.

In some embodiments, the improved mechanisms for testing error recovery provide the capability of testing the system's response to expected and unexpected errors. For example, injected errors can be categorized as expected. On the other hand, the system can also respond to unexpected errors, such as unexpected failures of non-volatile memory cells. This has the effect of testing error recovery mechanisms of the system in an efficient and predictable manner, which helps to ensure a reliable system operation. In addition, error recovery mechanisms can be reliably tested and/or debugged more efficiently. Thus, the mechanisms described herein can help to ensure that error recovery mechanisms are performed within a preset time that can be derived from or is dictated by system requirements. The details of error injection mechanism performed by the bridge device can be abstracted from the controller, which makes the system modular and more dependable. Moreover, the improved mechanisms for testing error recovery help with ensuring integrity and/or reliability of the non-volatile memory, namely ensuring that it meets endurance (e.g., the number of program/erase cycles the non-volatile memory can endure before failure) and/or data retention (e.g., the measure of non-volatile memory cells' ability to retain data) criteria.

System Overview

Example storage systems implementing the various error recovery testing improvement mechanisms and components will now be described. Those skilled in the art will recognize that the error recovery testing improvement mechanisms may be implemented in various NVM storage systems that are different than those described in this disclosure. FIG. 1A is a block diagram that illustrates a controller-bridge architecture according to some embodiments of the invention. The architecture is described in detail in patent application Ser. No. 13/226,393, entitled "Systems and Methods for an Enhanced Controller Architecture in Data Storage Systems," filed Sep. 6, 2011 and issued as U.S. Pat. No. 8,700,834, the disclosure of which is hereby incorporated by reference in its entirety. To summarize, as is shown in FIG. 1A, a solid-state non-volatile storage system 120 is connected to a host system 110. The host system 110 communicates with the non-volatile storage system 120 using a storage interface 112. The host's storage interface 112 can communicate with the non-volatile storage system 120 using any known communication protocol, such as SATA, SCSI, SAS, USB, Fibre Channel, PCIe, eMMC, etc.

In one embodiment, the non-volatile storage system 120 includes a controller 130 and a NVM storage module 150. The controller 130 in one embodiment communicates with a bridge device 152 within the NVM storage module 150 via a high level interface such as PCIe (through bus logic/interface 140). PCIe is used in one embodiment as it defines a rich packet based routing and Quality of Service (QoS) infrastructure and provides a high speed interface. The controller may include a processor 136 to control data functions, and the core may be coupled with static memory 132 and dynamic memory 134. The controller 130 may also include a data path 138 for processing/transferring data related to data access commands from the host system 110. In one embodiment, the controller 130 is implemented on a SoC (System on Chip), though those skilled in the art will recognize that other hardware/firmware implementations are possible.

In one embodiment, the use of PCIe means that the address range assigned to a device function is used for packet routing both on the fabric and within the device. In one embodiment, the PCIe transaction layer delivers packets to an internal register interface that is read by firmware. Advanced devices often direct incoming packets to internal RAM or hardware acceleration modules.

The bridge device 152 in one embodiment comprises bus logic/interface 154 for communicating with the bus logic/interface 140 (on the controller 130) over the high level interface bus. On the other end of the bridge, the bridge device 152 includes a low level interface 158 such as ONFI for communicating with the NVM storage 160 (e.g., NAND), which may include a number of storage devices such as flash dies 162, 164, 166, and 168. In some embodiments, the bridge device is configured to perform the reliability improvement functions, including reporting media health information to the controller or performing error injection. Although ONFI is depicted in this embodiment, other suitable flash memory interfaces may be used. In another embodiment, the bridge may use a different interface such as Toggle or a proprietary interface to communicate with the NVM storage 160, or send direct commands to the storage.

The architecture reduces latency and addresses the various design constraints while allowing the controller and bridge designers to optimize their respective portions of the architecture. In one embodiment, the controller is responsible for block level management, parity stripe layout, garbage collection, wear leveling, handling read disturb and error recovery. The bridge device, in one embodiment, manages the raw NVM flash interface. It may also provide one or more of: command queuing, error correction, XOR parity accumulator, data protection, and enhances block endurance. The interface between the bridge and the controller in one embodiment is a lightweight PCIe-based data and management interface. The controller uses the interface control command to configure the bridge and data commands to access the NVM media.

It is also noted that the controller uses physical page addressing instead of a logical one that is common in existing controller-bridge designs. The bridge can identify the relationship between pages, blocks, planes, and dies. This gives the controller the greatest flexibility for creating RAID stripe layout, performing data moves, and handling bad blocks. These details are abstracted from the bridge. When using direct addressing, the controller simply provides a set of direct page addresses in the command header to the bridge. In one embodiment, the pages are not necessarily sequential or even in the same block. In most cases, the controller will access pages spread across multiple planes and multiple dies in order to maximize concurrent hardware access.

Figure 1B:
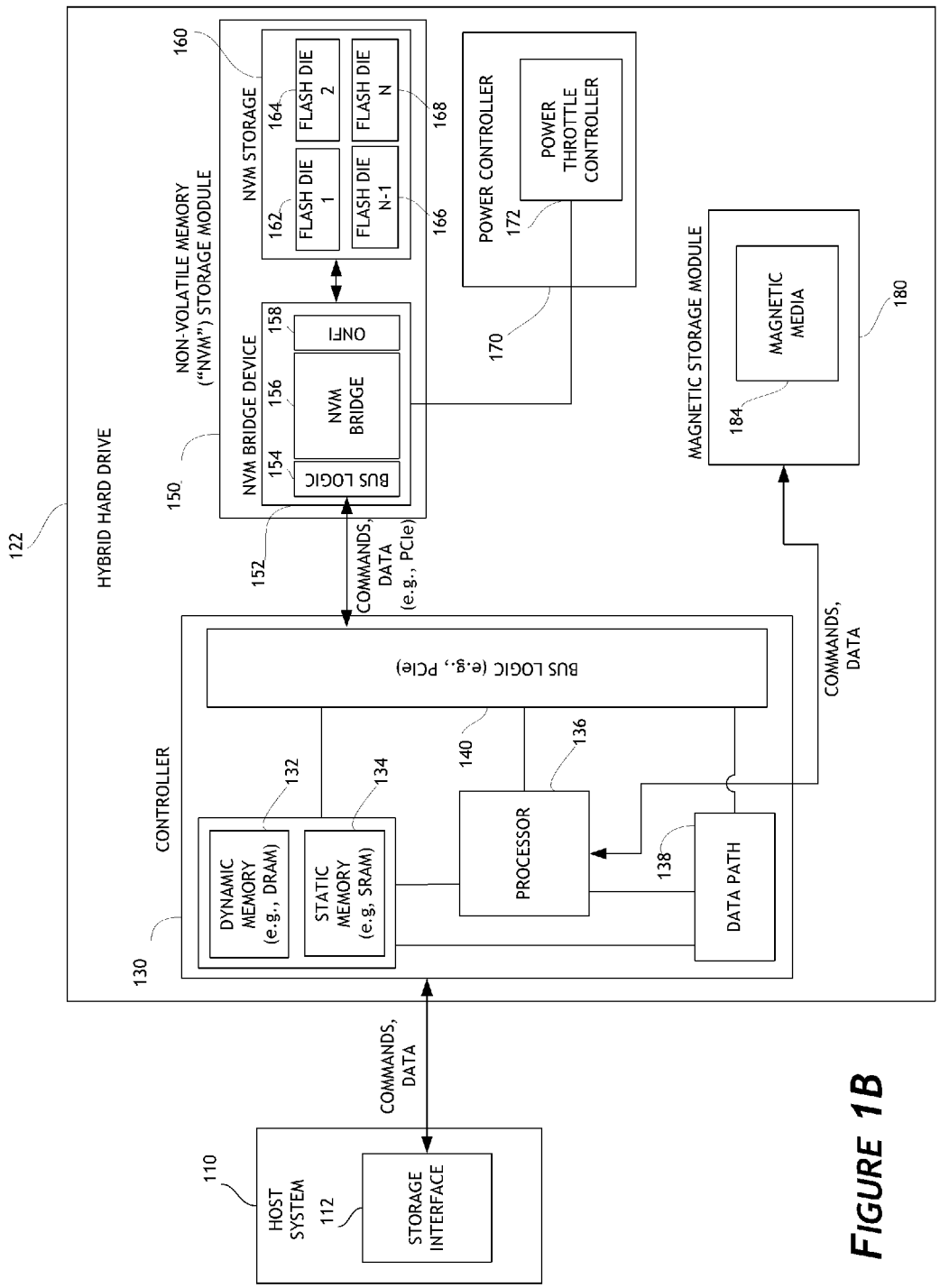

Some embodiments of the controller-bridge architecture can be adapted for other uses. For example, FIG. 1B shows the use of the controller architecture in a hybrid drive 122, which in addition to the NVM and bridge components described above, includes a magnetic storage module 180 which has a magnetic media 184 such as a rotating hard disk drive (HDD). The controller 130 in this embodiment would thus manage data accesses to both the NVM storage module 150 and magnetic storage module 180. In one embodiment, a different interface than interface 140 (which connects to the NVM) may be used to connect the controller 130 to the magnetic storage module 180.

The hybrid application illustrates an additional advantage of the controller architecture. A hybrid drive typically includes an SSD that has its own internal controller that has a mapping table to address the NVM within the SSD. While the HDD portion of the hybrid is typically addressed directly, the hybrid controller uses a special mapping table to determine whether data is in the SSD or the HDD. The use of this special mapping table along with the internal SSD mapping table introduces duplicate overhead in cases where data is accessed in the SSD of the hybrid, since there are two mapping tables and there is significant cost associated with maintaining each table.

In contrast, because the controller 130 in the present architecture manages the NVM at both the block and page levels and the magnetic media, it can provide uniformed address management across the flash and magnetic media in a single location. Hence there is no need to have the two tables noted above. This has the advantages of reducing duplicative table lookups and all the associated costs/complexities related to maintaining separate mapping tables. Direct page addressing is used in the unified mapping scheme.

In addition, in a hybrid application, the NVM could still provide effective performance enhancement even when it has a large amount of bad blocks (e.g., 50%). In one hybrid embodiment, the controller also has efficient address gap handling capability (on gaps caused by the bad blocks). In an alternative hybrid embodiment, the unified addressing scheme does not necessarily require a bridge to work with the controller. The controller can potentially use a raw NVM interface (e.g., ONFI) to access the NVM.

Figure 2:
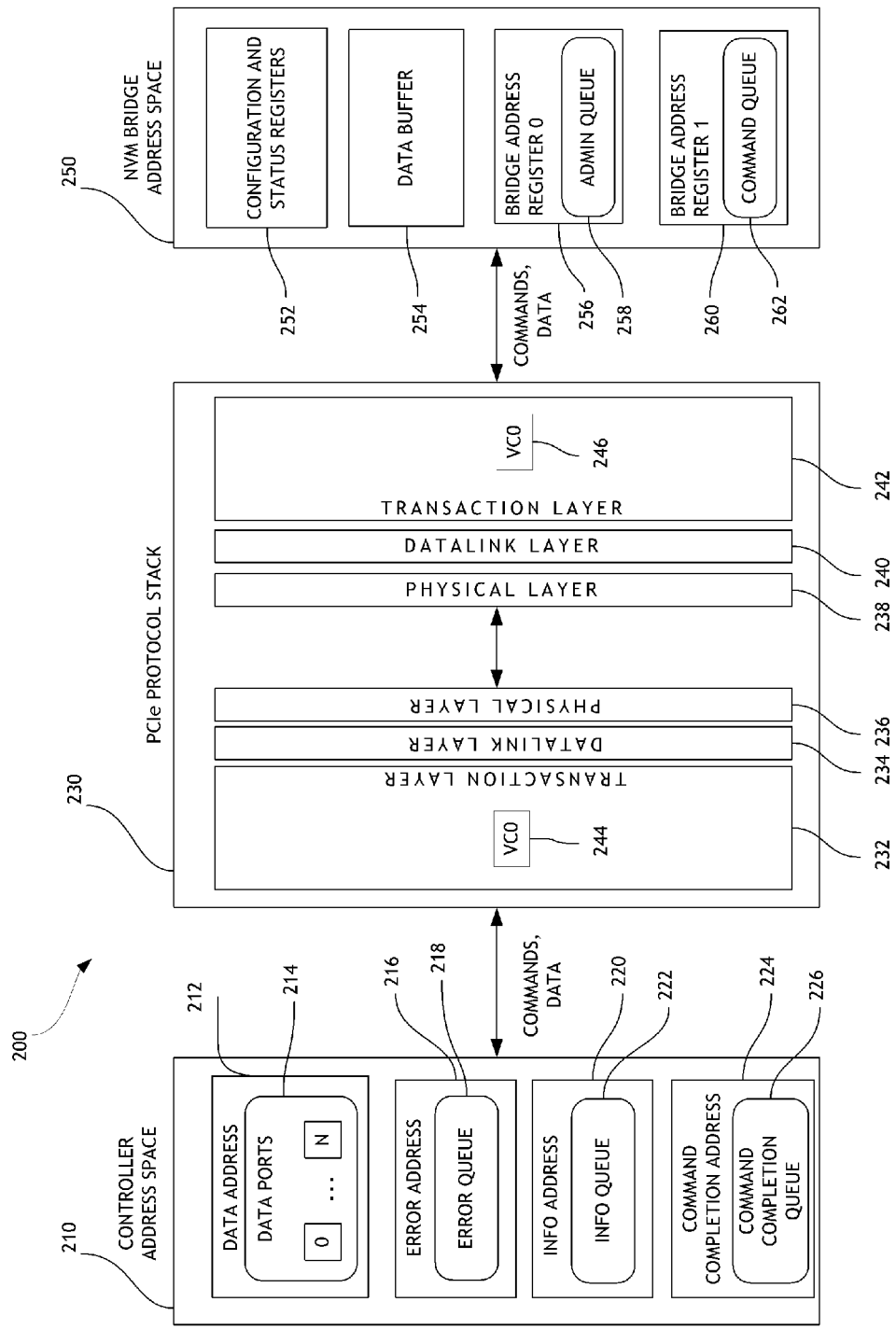
FIG. 2 is a block diagram illustrating the command processing components between the controller and the bridge device according to one embodiment.

FIG. 2 is a block diagram illustrating the command processing components between the controller and the bridge device according to one embodiment. Command processing components are described in detail in patent application Ser. No. 13/226,393, entitled "Systems and Methods for an Enhanced Controller Architecture in Data Storage Systems," filed Sep. 6, 2011 and issued as U.S. Pat. No. 8,700,834, the disclosure of which is hereby incorporated by reference in its entirety. To summarize, using the construct of the PCIe interface (or other equivalent interfaces), both the controller and the bridge implement its own address spaces (210, 250) in their respective device memories that can be addressed by the other device. Messages are communicated by writing to queues located within certain addresses within the address spaces, and the addresses are stored in the configuration and status registers 252 in one embodiment.

In one embodiment, the controller sends data access commands to a command queue 262 in the bridge device. This is performed by the controller sending data command messages to the bridge (by writing to the command queue BAR (base address register)). In one embodiment, the command queue has room for sixteen messages, though the number of messages can vary in other embodiments. The command queue can be implemented in a number of ways. One option is full hardware automation where the controller simply writes to a fixed offset. Alternately it can be implemented in memory using a ring buffer or an array based linked list. In one embodiment, the implementation must allow for efficient insertion and notification with minimal bus traffic. In one embodiment, the controller knows the current queue depth based on the number of status responses the bridge has sent back (e.g., a message to the controller's completion queue indicating completion of a command). Note that the data commands are much smaller than the actual data. A given record slot in the queue is considered available once the bridge sends back a completion status or an error report.

In the embodiment shown in FIG. 2, the bridge side 250 also implements configuration and status registers (CSR) 252, along with an admin queue 258 for receiving, from the controller, command messages related to operation of the command queue (e.g., a message for pausing the command queue) or administrative messages concerning the bridge's operation in general. For example, the admin queue may be used by the controller to communicate various commands related to media health scans or error injection. The admin queue 258 may be implemented in a fashion that is similar to the command queue, such as through full hardware automation or ring buffer. Also, like the command queue, the admin queue may be configured for efficient insertion and notification with minimal bus traffic. Like the command queue, the controller can derive the current queue depth and available slots based on responses from the bridge.

On the controller side 210 are a set of data ports 214 at data addresses 212 and a number of status queues. In one embodiment, the status queues include an error queue 218, an information queue 222, and a command completion queue 226. These queues are responsible for receiving messages from the bridge regarding command processing, as well as current status of the bridge and the NVM. In one embodiment, the controller implements three status queues to simplify command transactions. The bridge uses the completion queue 226 to indicate when it has successfully completed one or more commands. The info queue 222 is used for non-critical information such as health reports. The error queue 218 allows the bridge to send detailed reports when one or more command fails. Those skilled in the art will recognize that the three queues could be combined into fewer queues or divided into additional queues. Alternatively, in lieu of these queues, the controller and the bridge may use an interrupt based system whereby the bridge would send an interrupt when it wishes to communicate with the controller. The controller may then check a message stored on the bridge side.

As shown in FIG. 2, the controller may also have several queues to enable the bridge to return information related to data commands (completion, error, etc.). In addition, the bridge can report other status, errors, and indicate non-critical information (i.e., info/health reports) related to the operation of the bridge and the NVM. These queues may be processed sequentially and may be implemented in memory as ring buffers with fixed record size in one embodiment. In one embodiment, the controller implements three status queues to simplify command transactions. The bridge uses the completion queue 226 to indicate when it has successfully completed one or more commands. The info queue 222 is used for non-critical information. The error queue 218 allows the bridge to send detailed reports when one or more command fails. Those skilled in the art will recognize that the three queues could be combined into fewer queues or divided into additional queues. Alternatively, in lieu of these queues, the controller and the bridge may use an interrupt based system whereby the bridge would send an interrupt when it wishes to communicate with the controller. The controller may then check a message stored on the bridge side.

Communications between the controller and the bridge are effected in one embodiment through a PCIe protocol stack 230 which includes a number of layers on both sides, including a transactional layer (232, 242), a data link layer (234, 240), and physical layer (236, 238). While PCIe is used in this disclosure to illustrate the operation of the controller and the bridge, other similar standards can be used as well.

The PCIe transaction layer assigns transmit credits based on how much room is left in its Virtual Channel (VC) buffer space. According to the PCIe specification, devices must implement VC0, though some devices implement additional VC to ensure high priority messages have dedicated resources. Packets are directed to the appropriated VC based on their Traffic Class (TC). The TC is also used to determine priority when packets are flowing over the PCIe fabric. Higher TC packets are generally given priority by the root complex, switches and end-devices.

In one embodiment, the controller is designed to operate using only VC0. In one embodiment, though the bridge may implement additional VC, it must be configurable so that it can operate in single VC mode. The messages communicated between the controller and the bridge will be better understood in view of the following brief description of the data processing flow. To service a read command from the host, the controller may first send a command message to the bridge's command queue. Once the bridge processes the command message, it will read the requested data from the NVM and send the read data back to a corresponding data port on the controller side. This action triggers the data path on the controller, which leads to the data being sent back to the host. Conversely, to service a write command from the host, the controller may first send a command message to the bridge's command queue. Once the bridge processes the command message, it will read from a corresponding data port on the controller side. This action triggers the data path on the controller, which leads to the write data being sent from a buffer in the controller to the bridge for writing to the NVM.

The controller in one embodiment communicates with the bridge using three message types of increasing priority: data to be written to the NVM for write commands (0), messages for the bridge's command queue (1) and messages for the bridge's admin queue (2). Those skilled in the art will recognize that different priorities may be assigned to these messages, and the messages could be combined into fewer types or divided into more types depending on the implementation. In one embodiment, under normal conditions, the controller sends a steady stream of data packets to the bridge.

In one embodiment, the bridge interacts with the controller using its own set of prioritized message types (listed here in increasing priority): data read from the NVM for read commands (0), messages for the controller's completion/info queues (1) and messages for the controller's error queue (2). Those skilled in the art will recognize that different priorities may be assigned to these messages, and the messages could be combined into fewer types or divided into more types depending on the implementation. As will be further described below, to facilitate fast processing of data access commands, a read or write by the bridge to a data port in the controller automatically triggers the data path in the controller. In one embodiment, it is not uncommon for the bridge to process several commands in parallel. In one embodiment, the bridge uses the completion queue 226 to notify the controller when commands have completed successfully. In additional, non-critical messages are sent to the info queue 222 while detailed error reports are sent to the error queue 218. In other embodiments, these queues may be combined into fewer queues (with different message types being distinguished by special flags or implied address values) or separated into more queues (e.g., different error queues for different types of error or different info queues for different types of information returned from the bridge).

In other embodiments where a different interface than PCIe is used, the PCIe protocol stack may be replaced with the appropriate stacks/layers of that interface. Those skilled in the art will recognized that other equivalent standardized interfaces (e.g., eMMC) may be adapted to replace PCIe. In other embodiments, a custom/proprietary interface may be used to handle communications between the controller and the bridge.

In some embodiments, commands sent to the command queue may include fields such as: a tag field, a priority field, a list of pages, and bits to control the XOR parity accumulator. When the bridge is ready to start working on a given command, it performs a read or a write operation on the appropriate data port 214 to trigger the data path on the controller side. In particular, in one embodiment, the data path includes logic for processing data transferred between the controller and the bridge. For example, for a write, write data is read from a memory buffer in the controller and processed by the data path (e.g., adding additional metadata) before it is sent to the bridge for writing to the NVM. Similarly, for a read, the data path also processes the incoming data from the bridge (e.g., stripping out metadata). The use of the data path on the controller simplifies the overall design and minimizes work that the bridge needs to perform for each command. Given the above, the data path needs to be configured/set up for the particular command that is currently being processed, so that the data to be transferred can be properly processed as being associated with the current command. This set up/configuration could be performed through some automation in the data path or by firmware on the controller processor 136. In either scenario, a read/write of a data port by the bridge in one embodiment triggers this configuration of the data path on the controller side. In other embodiments, multiple data paths may be used with each handling a subset of the data ports, though in this scenario the data paths would still operate based on the above described principles.

In some embodiments, for a read command, the bridge obtains data from the NVM and writes to a corresponding data port 214 and for a write command, the bridge reads data from a corresponding data port 214 and writes to the NVM. In other embodiments, other less efficient variations are possible. For example, the controller may read and write the transactions, and the bridge may simply notify that attention is needed via an interrupt, etc.

In some embodiments, each command in the bridge command queue 262 has a tag. When the bridge is ready to start working on a command that involves a data transfer, it accesses the data port 214 that matched the command tag. In one embodiment, the data path in the controller has sixteen ports defined by two values in the bridge CSR: base address and port size. These two values are sufficient to derive the location of all sixteen ports. In other embodiments, a different number of ports and/or a different address derivation scheme may be used.

In some embodiments, each data port (e.g., 0 to 15) is associated with a command tag. In one embodiment, commands are limited to eight pages. Under such an arrangement, the ports need to be at least 64K apart, though the spacing can be larger. Thus, performing a read or write on the port matching the command tag allows the controller to automatically identify the matching command and initiate the data path automation without additional control overhead.

For example, when the bridge accesses a particular data port address in the controller (e.g., No. 0 of 15) defined by the associated PCIe address range, the controller will understand that this is for the command associated with that tag. Thus, there is no need for the bridge to separately send a command tag, which reduces overhead as each additional communication between the bridge and the controller adds to the overall latency. To accomplish this, in one embodiment the controller automatically decodes the address (split the upper bits), and loads the registers to trigger/prime the host data path for processing (initiating the automation). However, those skilled in the art will recognize implementations other than the above described implied tag implementation could be used. For example, the bridge could send an explicit command tag message to the controller to indicate the command the bridge is currently working on and which data port it intends to use. The priming of the data path would then be dependent on that explicit command tag message. In other embodiments, the command tags as described above need not be used. Generally, any command configuration data that enables the bridge and/or the controller to keep track of the data port and command correlation can be used.

In some embodiments, the controller data path is automatically triggered when a data port is accessed by the bridge. In one embodiment, the data path must complete a command once it has been triggered, as there is no mechanism that allows the bridge to work on parts of a command. In one embodiment, when the bridge starts a write operation, the controller sends all pages to be written to the bridge in the order specified by the command message. Conversely, the controller may also require the bridge to send data for a read operation in the order specified by the command message. While the example provided herein shows one data path that handles both reads and writes, in other embodiments multiple data paths could be used. For example, in a multiple data path implementation each data path could be dedicated to a sub-set of the data ports, and/or certain data paths may be configured to handle reads and other data paths may be configured to handle writes. When the bridge executes the command, it returns status message(s) to one or more queues on the controller side. In an alternative embodiment, in lieu of using tags, the bridge may send the controller a block of data to program the data path. The bridge does not have to know what the data does. The block of program data would be sent first by the controller to the bridge along with the command. The bridge would then send the block back. The program data can be sent ahead of the data to be transferred for the command or it can be sent to another queue.

In another embodiment, instead of the implied command tag/data path trigger mechanism describe above, the controller-bridge could communicate in a controller-push model in which the controller sends data along with the commands to the bridge. The bridge would thus need a large volatile memory buffer capacity to hold the user data from the controller for the various commands in the bridge's command queue. This implementation could reduce latency but potentially increase the cost of bridge implementation as a large memory buffer will need to be added to the bridge. This also leads to increased power consumption by the bridge.

In some embodiments, the command queue 262 supports sophisticated queuing and out-of-order execution, while the admin queue is ordered. The various queues on both the controller and bridge sides can have a mixture of commands outstanding, and can be asynchronous. The mixture of commands is particularly notable in the bridge command queue as compared to the ONFI specifications. ONFI provides some basic queuing capability through its "read multiple" and "write multiple" commands. However, there can be no mixing of different types of commands. Moreover, commands are batch processed, which means that the commands must clear the queue completely before more commands can be accepted.

In contrast, the advanced queuing capability of the bridge can (1) accept mixed command types, (2) support out of order execution, and (3) allow the controller to send additional commands without having the queue(s) be cleared first. The bridge can also accept special commands from the controller to specify that a certain command be executed with high priority. The bridge manages several channels so it has the flexibility to re-order the commands it receives.

A unique feature in the queuing model is the implementation of a background priority in one embodiment. The background priority lets the bridge decide when to execute the command. In one embodiment, commands with the "background" flag are unordered and given the lowest priority. They may also be exempt from the command promotion timer requirement, which is a time value dictating a deadline by which a certain command should be executed. In one embodiment, although the order of command execution is left up to the bridge, a command cannot sit in the queue indefinitely. When the bridge is choosing between unordered commands on the pending list, it will give preference to commands that have expired promotion timers. The timeout value is set by the controller in the bridge control CSR field in one embodiment.

The bridge may work on these "background" commands when it has available resources. For example, background priority can be used for data retention, health scan, and error injection tasks. As another example, the controller may send down a block erase command with the background flag set. The bridge will perform the erase operation when the target die is not needed for other commands in the queue. In one embodiment, the "ordered," "priority," and "background" flags are mutually exclusive. This background command feature is currently absent in in-band I/O interfaces (e.g., UFS, eMMC, SAS or SATA), as they do not support background long running tasks.

Types of Error Injection

As previously discussed above, the above described controller-bridge environments are just several example implementations of error injection concepts. These concepts are broadly applicable to other NVM designs as well. Therefore, in the sections below, where appropriate, the various concepts and mechanisms of the some embodiments will be generally described as being performed by a "receiver" device and/or a "sender" or "requester" device.

In some embodiments, several types of error injection operations can be supported by the system, including "direct" and "delayed" operations. In some embodiments, the system can support the injection of "memory management errors" or "media errors" (i.e., non-volatile memory errors) and "protocol errors" (i.e., errors relating to the communication protocol between a sender and receiver).

In some embodiments, performing direct error injection causes an immediate error recovery following the execution of a storage access command or operation into which the error was introduced. As explained below, direct errors include read fail, program/copy fail, erase fail, data path errors, and queuing errors.

In some embodiments, performing delayed error injection includes introducing an error that is not detected and/or corrected until a later command or operation. As explained below, delayed errors include location not written/programmed, page correctible errors, and page uncorrectable errors. In some embodiments, delayed errors are detected and/or corrected when a subsequent read operation directed to the corrupted non-volatile memory location is executed.

In some embodiments, different types of injected errors relate to testing different types of error recovery mechanisms implemented by the system. For example, media errors can test error recovery mechanisms implemented by the bridge (e.g., ECC mechanisms) and the controller. The latter can include recovering from accessing corrupted data that could not be corrected by the ECC, which can include executing or adjusting parameters of a wear leveling policy, bad block management policy, data redundancy policy, programming policy, policy relating to shifting from multi-level cell mode to single-level cell mode, etc. Protocol errors can test error recovery mechanisms relating to the communication protocol between the controller and bridge, which can include detecting erroneous messages, requesting corrected messages, discarding erroneous messages, re-initializing the communication protocol, etc.

In some embodiments, a sender (e.g., a controller device) configures a receiver (e.g., a bridge device) to perform error injection. In some embodiments, the controller device configures the bridge device into error injection operating mode, which can persist until cleared by the controller device. For example, the error injection mode can be programmed by the controller in the CSR 252 illustrated in FIG. 2, or via an administrative message written to the admin queue 258. In some embodiments, the bridge can inject errors into every command or operation until the error injection mode has been cleared by the bridge. In some embodiments, the bridge can inject errors into data stored in a single addressable location in the non-volatile memory (e.g., a page), into a range of addressable locations (e.g., 64 pages), or into entire non-volatile memory.

In some embodiments, the bridge can generate and provide to the controller an error report reflecting the execution status of commands or operations into which errors were injected. As further explained below, information in the error report can include an indication of success or an appropriate error code. In some embodiments, the bridge can generate the error report due to direct or delayed errors. In some embodiments, the bridge can generate the error report due to a command or operation that triggers the error recovery in response to a previously introduced delayed error. In some embodiments, the bridge writes the generated error report to the controller's error queue 218, as is illustrated in FIG. 2.

In some embodiments, error injection mechanisms can be performed before the system is put into operation (e.g., into use by a customer), such as during the development cycle, testing cycle, and quality assurance cycle. In some embodiments, error injections mechanisms can be performed when the system is already in operation. In some embodiments, error injection can be implemented in the background. As explained above, the bridge may work on these "background" error injection operations when it has resources not used for performing higher priority data access commands communicated by the controller. The bridge can perform background error injection operations periodically or whenever it has available resources.

Direct Error Injection

Figure 3:
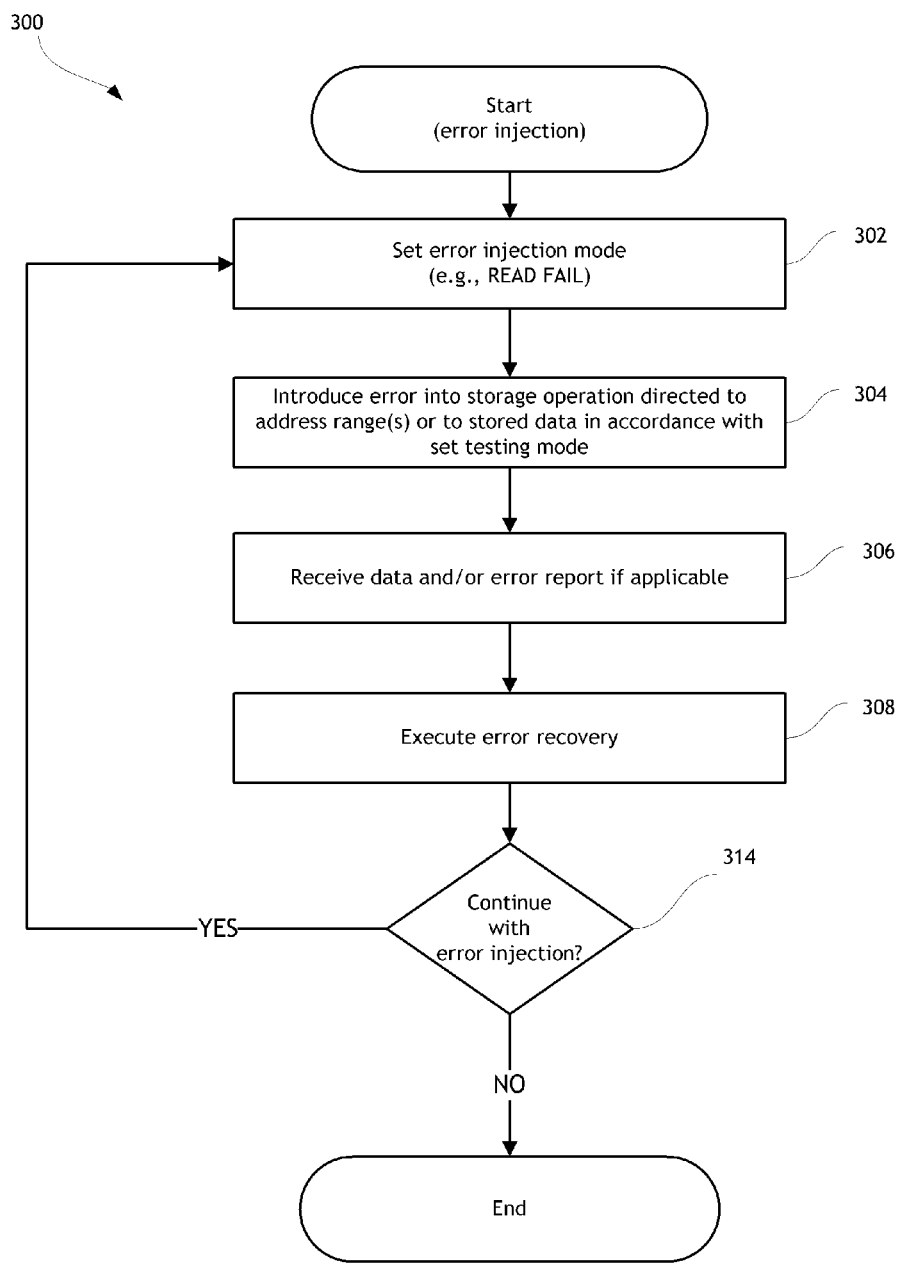
FIGS. 3-4 are flow diagrams illustrating improved mechanisms for testing of error recovery in accordance with some embodiments of the invention.

FIG. 3 is a flow diagram that illustrates direct error injection operations according to some embodiments. In some embodiments, the process 300 can be executed by a sender (e.g., a controller) and a receiver (e.g., a bridge). The process 300 begins when, in block 302, the controller programs the bridge to operate in an error injection mode. In some embodiments, the controller programs the CSR 252 illustrated in FIG. 2, or writes an administrative message to the admin queue 258. In some embodiments, the controller can program the bridge to operate in a particular direct error injection mode, namely inject a particular type of error (direct memory management errors or direct communication protocol errors). Examples of direct memory management errors include:

Read fail: any read operation from a non-volatile memory location (e.g., a page) or range of locations is accepted by the bridge, but an error report reflecting that the read operation failed is generated and communicated to the controller. It is understood that the error is generated by the system and is does not reflect that non-volatile memory locations are unreliable. As explained below, in some embodiments, no data is returned to the controller. Format of the error report is explained below.

Program fail/Copy fail: the bridge corrupts data such that it cannot be corrected by the error recovery mechanisms (e.g., by ECC). This causes the bridge to accept a program/copy operation directed to a non-volatile memory location (e.g., a page), but to generate an error report reflecting that the operation failed. It is understood that the error is generated by the system and is does not reflect that non-volatile memory locations are unreliable. Format of the error report is explained below.

Erase fail: any erase operation directed to a non-volatile memory location (e.g., a block) or locations are accepted but not executed. The bridge generates an error report reflecting that erase operation failed. It is understood that the error is generated by the system and is does not reflect that non-volatile memory locations are unreliable. Format of the error report is explained below.

Examples of direct communication protocol errors include:

Data path error: the bridge accesses incorrect data port address(es) in the controller address space 210 (FIG. 2), which triggers incorrect data path(s), or sends an explicit command tag message(s) with incorrect command tag(s).

Queuing error: with reference to FIG. 2, the bridge sends incorrect messages to controller's command completion queue 226 (e.g., completion messages for commands that were never sent by the controller), info queue 222, and/or error queue 218. Another type of queuing error is disregarding the queuing order or constraints of the queues.

With reference to FIG. 3, the process transitions to block 304 where the bridge introduces a direct error of the type specified in block 302. The error can be introduced into storage or data access operation(s) directed to a non-volatile memory address (e.g., a page) or range of non-volatile memory addresses (e.g., 64 pages). For example, the bridge can inject a read fail error into a page read operation. In block 306, the bridge communicates a generated error report to the controller, if applicable. For example, the bridge may not generate an error report for communication protocol errors. Several formats of the error report are explained below. In some embodiments, the bridge may return retrieved data to the controller. In block 308, the process executes error recovery mechanisms to detect and correct the injected error(s). Error recovery can be executed by the bridge, the controller, or both. Then, the process transitions to block 314 where it determines whether to continue with error injection. In some embodiments, the bridge checks whether the controller programmed the CSR 252 illustrated in FIG. 2, or whether the controller wrote an administrative message to the admin queue 258. If the process determines to continue with error injection, it transitions back to block 302. Otherwise, error injection is terminated.

Delayed Error Injection

Figure 4:
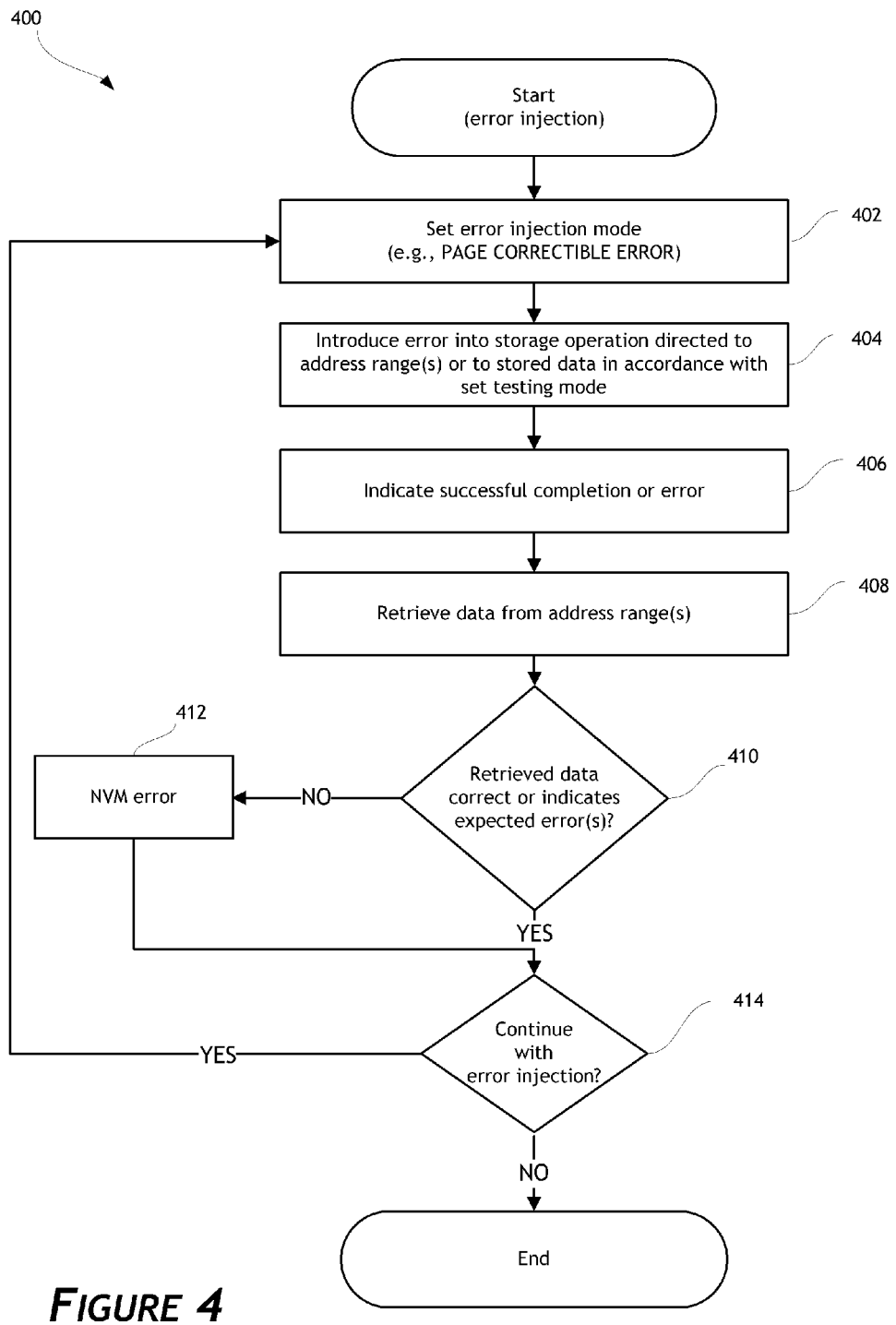

FIG. 4 is a flow diagram that illustrates delayed error injection operations according to some embodiments. In some embodiments, the process 400 can be executed by a sender (e.g., a controller) and a receiver (e.g., a bridge). The process 400 begins when, in block 402, the controller programs the bridge to operate in an error injection mode. In some embodiments, the controller programs the CSR 252 illustrated in FIG. 2, or writes an administrative message to the admin queue 258. In some embodiments, the controller can program the bridge to operate in a particular delayed error injection mode, namely inject a particular type of error. Examples of delayed memory management errors include:

Page correctible error: the bridge silently (i.e., without the controller's knowledge) corrupts data programmed or written to non-volatile memory location(s) (e.g., page(s)) so that it is difficult, but possible to later recover the programmed data. The bridge indicates to the controller that the program or write operation was executed successfully.

Page uncorrectable error: the bridge silently (i.e., without the controller's knowledge) corrupts data written to a non-volatile memory location(s) (e.g., page(s)) so that it is impossible to later recover the programmed data. The bridge indicates to the controller that the program or write operation was executed successfully.

Location not written/Location not programmed: any write operation to non-volatile memory location(s) (e.g., page(s)) is accepted by the bridge, but the location(s) is not actually written/programmed. The bridge reports a successful completion of the write operation to the controller.

Next, the process transitions to block 404 where the bridge introduces a delayed error of the type specified in block 402. The error can be introduced into storage or data access operation(s) directed to a non-volatile memory address (e.g., a page) or range of non-volatile memory addresses (e.g., 64 pages). For example, the bridge can inject a page correctible error into a page write operation. In block 406, the bridge indicates to the controller that data access operation(s) encountered an error. The controller can treat the error as an expected error and not as a non-volatile memory defect. In block 408, the process can execute delayed error recovery. For example, the controller can request a page read operation directed to the page(s) corrupted by the bridge. This can cause the bridge to execute an ECC mechanism to recover the uncorrupted data.

In block 410, the bridge can return retrieved data to the controller. The controller can verify that recovered data matches the expected data (e.g., data that controller requested to be written in block 404). If the process verifies that the recovered data is correct, it transitions to block 414, where it determines whether to continue with error injection. In some embodiments, the bridge checks whether the controller programmed the CSR 252 illustrated in FIG. 2, or whether the controller wrote an administrative message to the admin queue 258. If the process determines to continue with error injection, it transitions back to block 402. Otherwise, error injection is terminated.

If the process determines that retrieved data is incorrect, it transitions to block 412. In some embodiments, this indicates an unexpected error, which reflects a defect of non-volatile memory location(s) where data is stored. The process can execute error recovery relating to the non-volatile memory defect, which can include executing or adjusting parameters of a wear leveling policy, bad block management policy, data redundancy policy, programming policy, policy relating to shifting from multi-level cell mode to single-level cell mode, etc. The process then transitions to block 414 where it determines whether to continue with error injection, as explained above.

In some embodiments, if the process injects a page uncorrectable error in block 402, the bridge's error recovery mechanism (e.g., ECC) may not be able to correct the corruption of stored data. In this case, when the process attempts to retrieve data in block 408, the bridge may return an error and/or only that portion of the data which its error recovery mechanism was able to recover correctly. In block 410, the process can determine that the bridge behaved in an expected fashion, which is in accordance with the uncorrectable error mode of operation.

In some embodiments, the process injects a location not written/location not programmed error in block 402. When the process attempts to retrieve data in block 408, the bridge may generate an error report indicating an attempt to read an unprogrammed page. In block 410, the process can determine that the bridge behaved in an expected fashion, which is in accordance with location not written/location not programmed error mode of operation.

In some embodiments, the bridge can inject errors, such as page correctible or uncorrectable errors, by generating invalid (e.g., corrupted) ECC data when writing data to the non-volatile memory. When, at a later time, data is being retrieved, the bridge will detect a mismatch between stored data and ECC data and trigger error recovery mechanisms. In some embodiments, the bridge can inject errors, such as page correctible or uncorrectable errors, by corrupting data provided by the controller. In some embodiments, the bridge can corrupt data while it is being stored in an intermediate storage location (e.g., volatile memory buffer, such as DRAM buffer) before being written to the non-volatile memory. In some embodiments, the bridge disables ECC mechanism when writing corrupted data into non-volatile memory to ensure that corruptions will not be corrected while data is being written. The bridge can generate valid ECC data, namely correct ECC data corresponding to corrupted data being written. When, at a later time, data is being retrieved, the bridge may not detect corruption as ECC data will match corrupted data. However, the controller will detect that data was corrupted, which will trigger error recovery mechanisms. In some embodiments, retrieved, deliberately corrupted data could have been further corrupted due a non-volatile memory defect. The ECC mechanism may be able to detect these further corruptions (i.e., unexpected errors) and, in certain cases, correct them. As explained above, additional error recovery relating to the non-volatile memory defect can be triggered. In some embodiments, the bridge can inject errors, such as page correctible or uncorrectable errors, by adjusting programming algorithm parameters (e.g., programming time) to cause the programming operation to execute incorrectly, thus corrupting data as it is being written to the non-volatile memory. The bridge can write valid ECC data corresponding to uncorrupted data provided by the controller. When, at a later time, data is being retrieved, the bridge will detect a mismatch between stored data and ECC data and trigger error recovery mechanisms.

Error Report Format

Figure 5A:
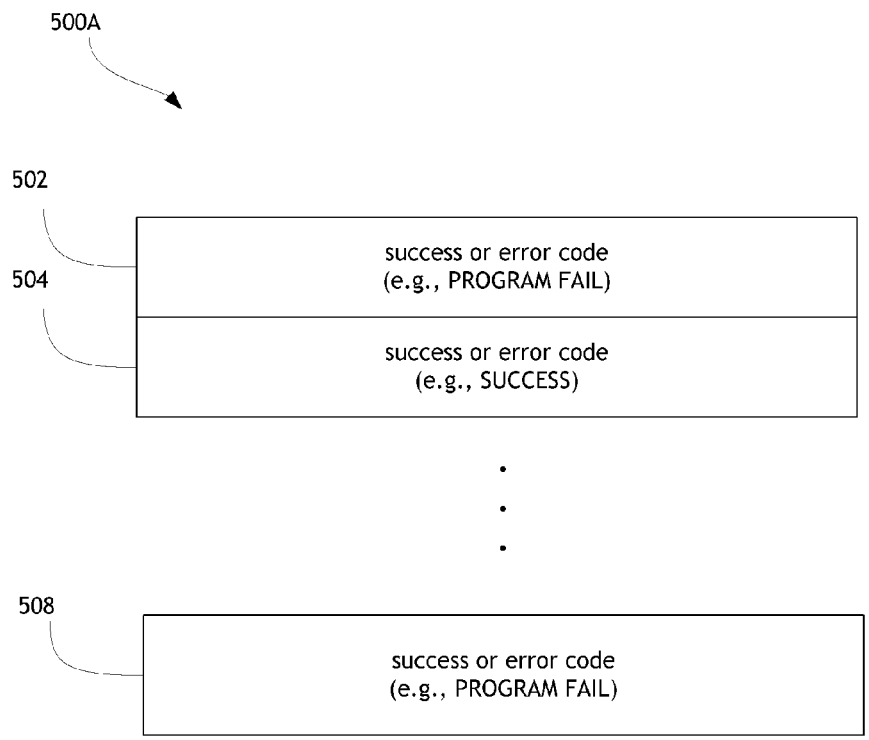
FIGS. 5A-5B are diagrams illustrating several report formats reflecting error information in accordance with some embodiments of the invention.

FIG. 5A illustrates the format of a generated error report 500A according to some embodiments. Error reporting is explained in detail in patent application Ser. No. 13/226,418, entitled "SYSTEMS AND METHODS FOR DETAILED ERROR REPORTING IN DATA STORAGE SYSTEMS," filed Sep. 6, 2011 and issued as U.S. Pat. No. 8,713,357, the disclosure of which is hereby incorporated by reference in its entirety. In some embodiments, the error report 500A is communicated by the receiver (e.g., a bridge) to the sender (e.g., a controller) in response direct or delayed error injection operations. As explained above, in some embodiments the bridge writes the generated error report 500A to the controller's error queue 220, as is illustrated in FIG. 2.

Block 502 indicates success or error code corresponding to storage access operation executed in location(s) of non-volatile memory. The location(s) (e.g., page address(es)) may have been communicated to the bridge as a parameter of a storage access operation, as is explained with respect to FIGS. 3-4. In some embodiments, the value in block 502 can reflect a program fail injected error, as is illustrated. In some embodiments, there may be more than one error code corresponding to the execution of the storage access operation. For example, the storage access operation can be executed in multiple locations of the non-volatile memory. As is illustrated in FIG. 5A, blocks 504 and 508 indicate other success or error codes. The order of success or error codes in 500A can be implied by the storage access command. In some embodiments, when multiple error codes are reported, the error report may need to include identifying information, such as the command tag corresponding to the storage access operation. This is further explained below in connection with blocks 520, 524, and 530 of FIG. 5B.

Figure 5B:
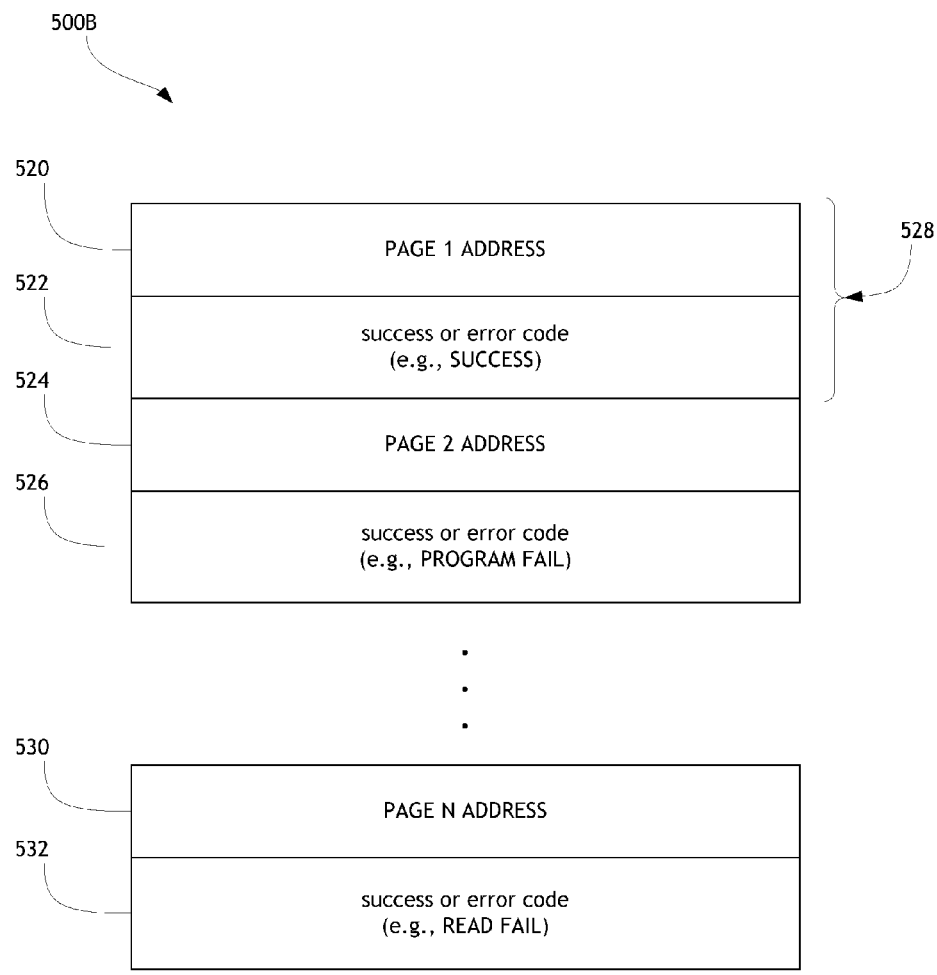

FIG. 5B illustrates the format of the error report 500B according to some embodiments. In some embodiments, the error report 500A is communicated by the receiver (e.g., a bridge) to the sender (e.g., a controller) in response direct or delayed error injection operations. As explained above, in some embodiments the bridge writes the generated error report 500A to the controller's error queue 220, as is illustrated in FIG. 2.

Block 520 indicates a first location of non-volatile memory into which an error was injected. For example, the first location can correspond to page 1 in a particular block of memory. The location (e.g., page address) may have been communicated to the bridge as a parameter of a storage access operation, as is explained with respect to FIGS. 3-4. Block 522 indicates success or error code corresponding to storage access operation executed in page 1. Bracket 528 illustrates that block pair {520, 522} corresponds to {location, success/error code} pair. This information allows the controller to uniquely match success/error code to a particular non-volatile memory location.

Similarly, block 524 indicates a second location of non-volatile memory into which an error was injected. For example, the second location can correspond to page 2 in a particular block of memory. Block 526 indicates success or error code corresponding to storage access operation executed in page 2. Block 530 indicates the Nth location of non-volatile memory into which an error was injected. For example, the Nth location can correspond to page N in a particular block of memory. Block 532 indicates success or error code corresponding to storage access operation executed in page N.

In some embodiments, as is illustrated in FIG. 5B, the number of entries 520, 522, 524, 526, 530, and 532 in the error report 500B is N. In some embodiments, the number of entries can correspond to the number of location(s) specified in a storage access command, as is explained with respect to FIGS. 3-4. In some embodiments, the order of entries 520, 522, 524, 526, 530, and 532 in the error report can correspond to the order to location(s) specified in the storage access command. In some embodiments, the error report 500B can be shortened or compacted to include only elements 522, 526, and 532 since, upon receiving the error report, the controller will be able to associate location(s) with the entries 522, 526, and 532.

In some embodiments, the error report 500B can include aggregated error reports corresponding to multiple error injection operations. For instance, it may be advantageous to minimize the traffic between the receiver (e.g., a bridge) and sender (e.g., a controller). In such embodiments, locations written in blocks 520, 524, and 530 can assist the controller in matching error information to the particular location in the non-volatile memory. Those skilled in the art will recognize that the error reporting can take on a wide variety of formats and that formats different from the various examples shown here may be used to report the injected errors described in this disclosure.

Other Variations

As used in this application, "non-volatile memory" typically refers to solid-state memory such as NAND flash. However, the systems and methods of this disclosure may also be useful in more conventional hard drives and hybrid drives including both solid-state and hard drive components. As such, while certain internal operations are referred to which typically are associated with solid-state drives, such as "wear leveling" and "garbage collection," analogous operations for hard drives can also take advantage of some embodiments of this disclosure. Solid-state memory may comprise a wide variety of technologies, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), or other discrete NVM (non-volatile memory) chips. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

Those skilled in the art will appreciate that in some embodiments, other types of error injection can be implemented. In addition, the actual steps taken in processes shown in FIGS. 3-4 may differ from those shown in the figures. Depending on the embodiment, certain of the steps described above may be removed, others may be added, and the sequence of steps may be altered and/or performed in parallel. Furthermore, in some embodiments, error injection operations can be implemented over any transport protocol, including SATA, SCSI, SAS, USB, Fibre Channel, PCIe, eMMC, etc. For example, a receiver (e.g., a bridge) can alert a sender (e.g., controller) to the fact that an error report has been generated by setting the alert bit of a status field, generating an interrupt, etc. Then, the sender can retrieve the error report. Accordingly, the scope of the present disclosure is intended to be defined only by reference to the appended claims.

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, the various components illustrated in FIGS. 1A, 1B, and 2 may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A bridge device configured to be coupled with a non-volatile memory in a data storage system, the bridge device further configured to:
   receive a storage access command from a controller;
   introduce at least one error into execution of the storage access command directed to at least one memory location in the non-volatile memory in accordance with a testing mode set by the controller; and
   provide to the controller a report indicating at least one of successful completion of the command and error,
   wherein at least one of the controller and the bridge is configured to execute an error recovery mechanism to recover from the at least one error, and
   wherein at least one of the controller and the bridge is further configured to, in response to determining that the report indicates an unexpected error as a result of the at least one memory location being defective, initiate the error recovery mechanism on the at least one memory location to correct the unexpected error.

2. The bridge device of claim 1, wherein the bridge is further configured to receive the storage access command over a first interface for receiving physical-address based storage access commands.

3. The bridge device of claim 1, wherein the bridge is further configured to communicate with the non-volatile memory over a second interface for communicating data access operations.

4. The bridge device of claim 1, wherein the at least one memory location comprises a memory location in non-volatile memory.

5. The bridge device of claim 1, wherein at least one of the controller and the bridge is further configured to assess performance of the error recovery mechanism.

6. The bridge device of claim 1, wherein the at least one memory location comprises a page of the non-volatile memory.

7. The bridge device of claim 1, wherein at least one of the controller and the bridge is further configured to, in response to determining that the report indicates an expected error as a result of the at least one error, initiate the error recovery mechanism to correct the expected error.

8. The bridge device of claim 1, wherein the testing mode comprises at least one of: injecting a page correctible error, page uncorrectable error, location not written error, read fail error, program fail error, and erase fail error.

9. The bridge device of claim 1, wherein the error recovery mechanism comprises error correction code (ECC) executed by the bridge and the at least one error is capable of being corrected by the ECC.

10. The bridge device of claim 1, wherein the error recovery mechanism comprises error correction code (ECC) executed by the bridge and the at least one error is not capable of being corrected by the ECC.

11. The bridge device of claim 1, wherein the at least one error comprises a corruption of data stored in the at least one memory location.

12. The bridge device of claim 1, wherein the bridge is further configured to:
    execute an additional command directed to the at least one memory location;
    generate a result of execution of the additional command; and
    communicate the result of execution to the controller, thereby causing the controller to execute the error recovery mechanism.

13. The bridge device of claim 12, wherein:
    execution of the storage access command corrupts data stored in the at least one memory location;
    the additional command comprises a data read command; and
    the result of execution comprises at least one of retrieved data and an error report indicating error encountered during execution of the data read command.

14. The bridge device of claim 13, wherein the execution of the command corrupts data in volatile memory before it is written to the at least one memory location.

15. The bridge device of claim 1, wherein the testing mode comprises introducing, by the bridge, errors into messages exchanged between the bridge and the controller.

16. The bridge device of claim 15, wherein the testing mode comprises at least one of injecting a data path error and a queuing error.

17. The bridge device of claim 1, wherein the bridge is further configured to execute the error recovery mechanism.

18. A method for testing a bridge device in a data storage system, the method comprising:
    receiving, by the bridge, a storage access command directed to at least one memory location in a non-volatile memory;
    in accordance with a testing mode, introducing, by the bridge, at least one error into execution of the storage access command;
    providing, by the bridge, a report indicating at least one of successful completion of the command and error;
    executing, by at least one of a controller and the bridge, an error recovery mechanism configured to detect the at least one error; and
    in response to determining that the report indicates an unexpected error as a result of the at least one memory location being defective, imitating, by at least one of the controller and the bridge, the error recovery mechanism on the at least one memory location to correct the unexpected error.

19. The method of claim 18, wherein the bridge configured to communicate with the controller over a first interface for receiving data access commands from the controller and communicate with the non-volatile memory over a second interface for communicating data access operations.

20. The method of claim 18, wherein the at least one memory location comprises a memory location in non-volatile solid-state memory.

21. The method of claim 18, further comprising, in response to determining that the report indicates an expected error as a result of the at least one error, initiating, by at least one of the controller and the bridge, the error recovery mechanism to correct the expected error.

22. The method of claim 18, further comprising executing the error recovery mechanism without executing an additional command directed to the at least one memory location.

23. The method of claim 18, wherein the testing mode comprises introducing, by the bridge, errors into messages exchanged between the bridge and the controller.

24. The method of claim 23, wherein the testing mode comprises at least one of injecting a data path error and a queuing error.

25. The method of claim 18, wherein the testing mode comprises at least one of: injecting a page correctible error, page uncorrectable error, location not written error, read fail error, program fail error, and erase fail error.

26. The method of claim 18, further comprising executing the error recovery mechanism following execution of an additional command directed to the at least one memory location.

27. The method of claim 26, wherein:
executing the storage access command corrupts data stored in the at least one memory location,
the additional command comprises a data read command, and
the error recovery mechanism is executed based at least in part on data retrieved from the at least one memory location or on an error report indicating error encountered during execution of the data read command.

28. The method of claim 18, further comprising programming, by the bridge, data in the non-volatile memory, wherein the error is introduced by modifying at least programming parameter.

29. The method of claim 18, wherein the error recovery mechanism comprises error correction code (ECC) executed by the bridge and the at least one error is capable of being corrected by the ECC.

30. The method of claim 18, wherein the error recovery mechanism comprises error correction code (ECC) executed by the bridge and the at least one error is not capable of being corrected by the ECC.

31. The method of claim 30, wherein the at least one error comprises a corruption of data stored in the at least one memory location.

32. The method of claim 18, further comprising assessing performance of the error recovery mechanism at least by measuring a time of execution of the error recovery mechanism.

* * * * *